US 9,609,257 B2

(12) United States Patent
Tanaka (10) Patent No.: US 9,609,257 B2
(45) Date of Patent: Mar. 28, 2017

(54) SOLID-STATE IMAGING DEVICE (71) Applicant: OLYMPUS CORPORATION, Tokyo (JP)

(72) Inventor: Takanori Tanaka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 172 days.

(21) Appl. No.: 14/644,893

(22) Filed: Mar. 11, 2015

(65) Prior Publication Data

US 2015/0189213 A1 Jul. 2, 2015

Related U.S. Application Data (63) Continuation of application No. PCT/JP2014/050637, filed on Jan. 16, 2014.

(30) Foreign Application Priority Data

Feb. 13, 2013 (JP) .................................. 2013-025473

(51) Int. Cl.
*H03M 1/34* (2006.01)
*H04N 5/378* (2011.01)
(Continued)

(52) U.S. Cl.
CPC ....... *H04N 5/378* (2013.01); *H01L 27/14636* (2013.01); *H04N 5/357* (2013.01); *H04N 5/369* (2013.01)

(58) Field of Classification Search
CPC ........ H04N 5/378; H04N 5/357; H04N 5/369; H01L 27/14636
(Continued)

(56) References Cited

U.S. PATENT DOCUMENTS 9,277,151 B2 * 3/2016 Ikedo ..................... H04N 5/374
9,307,171 B2 * 4/2016 Kawahito ............ H04N 5/3745
(Continued)

FOREIGN PATENT DOCUMENTS

JP 2005-323331 A 11/2005
JP 2009-89050 A 4/2009
(Continued)

OTHER PUBLICATIONS

International Search Report dated Mar. 25, 2014, issued in corresponding application No. PCT/JP2014/050637.
(Continued)

*Primary Examiner* — Brian Young
(74) *Attorney, Agent, or Firm* — Westerman, Hattori, Daniels & Adrian, LLP (57) ABSTRACT

A solid-state imaging device includes: a first substrate; a second substrate; a pixel unit in which pixels are disposed in a matrix; and an A/D conversion unit that is disposed for every columns of the pixels and counts a count clock for only a period according to a magnitude of the pixel signal. The A/D conversion unit includes: counter units that is provided in one of the first substrate and the second substrate and generates n-bit count signals; memory units that is provided in the other of the first substrate and the second substrate and holds the count signals and outputs the held count signals to horizontal signal transfer lines; and a connection unit that connects each counter unit to a corresponding one of the memory units and simultaneously transfer the count signals from at least two counter units to at least two memory units.

4 Claims, 10 Drawing Sheets (51) Int. Cl.
  *H01L 27/146* (2006.01)
  *H04N 5/369* (2011.01)
  *H04N 5/357* (2011.01)
(58) Field of Classification Search
  USPC .......................................... 341/169, 164, 155
  See application file for complete search history.

(56) References Cited

U.S. PATENT DOCUMENTS

| | | | |
|---|---|---|---|
| 9,319,646 B2 * | 4/2016 | Masagaki | H04N 9/045 |
| 9,338,383 B2 * | 5/2016 | Ishii | H04N 5/378 |
| 2011/0050969 A1 | 3/2011 | Nishihara | |

FOREIGN PATENT DOCUMENTS

| | | |
|---|---|---|
| JP | 2011-71958 A | 4/2011 |
| JP | 2012-151613 A | 8/2012 |
| JP | 2013-110566 A | 6/2013 |
| WO | 2006/129762 A1 | 12/2006 |

OTHER PUBLICATIONS

Notice of Allowance dated Oct. 18, 2016, issued in counterpart Japanese Patent Application No. 2013-025473, with English translation. (6 pages).

* cited by examiner

SOLID-STATE IMAGING DEVICE

CROSS REFERENCE TO RELATED APPLICATIONS

This application is a continuation application based on a PCT Patent Application No. PCT/JP2014/050637, filed Jan. 16, 2014, whose priority is claimed on Japanese Patent Application No. 2013-025473, filed Feb. 13, 2013, the entire content of which are hereby incorporated by reference.

BACKGROUND OF THE INVENTION

Field of the Invention

The present invention relates to a solid-state imaging device for use in a digital camera, a digital video camera, an endoscope, and the like.

Description of the Related Art

Figure 8:
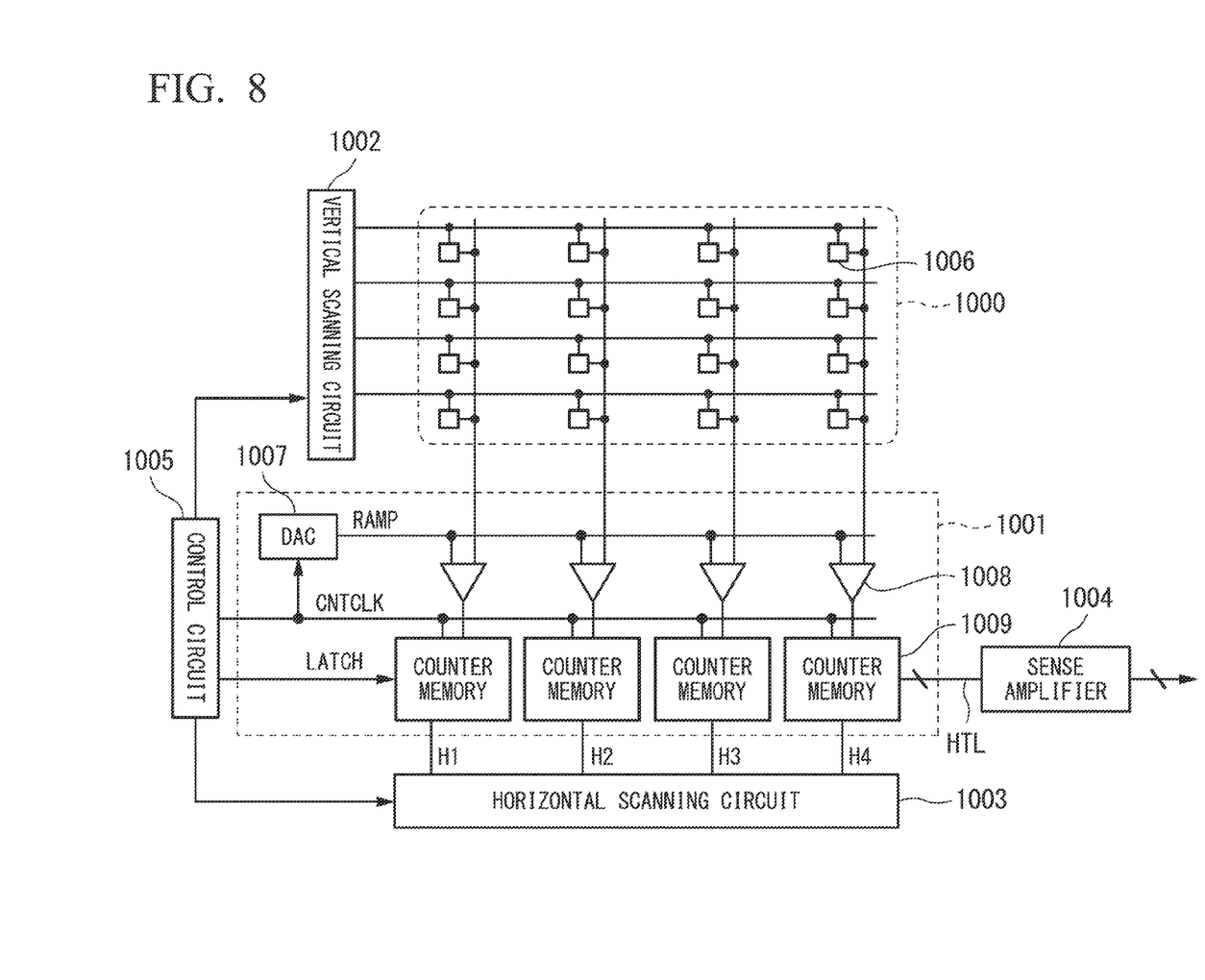
FIG. 8 is a block diagram illustrating a configuration of a conventional solid-state imaging device.

A column analog-to-digital (A/D) type solid-state imaging device is known as a means for performing A/D conversion on a pixel signal read from a pixel and implementing high-speed reading of a pixel signal (for example, see Japanese Unexamined Patent Application, First Publication No. 2005-323331, hereinafter referred to as Patent Literature 1). FIG. 8 illustrates a configuration equivalent to a solid-state imaging device disclosed in Patent Literature 1.

The solid-state imaging device illustrated in FIG. 8 includes a pixel unit 1000, an A/D conversion circuit 1001, a vertical scanning circuit 1002, a horizontal scanning circuit 1003, a sense amplifier 1004, and a control circuit 1005. The pixel unit 1000 has a plurality of pixels 1006 disposed in a matrix and generates a pixel signal. The pixel 1006 has a photoelectric conversion element for converting incident light into an electric signal and generates a pixel signal. The A/D conversion circuit 1001 constitutes a so-called single-sloped A/D conversion circuit (SSADC), and includes a digital-to-analog converter (DAC) 1007, a comparator 1008, and a counter memory 1009. The comparator 1008 and the counter memory 1009 are arranged for every pixel column.

The DAC 1007 generates a ramp signal RAMP that varies stepwise. The comparator 1008 generates a pulse signal having a pulse width corresponding to a magnitude of the pixel signal based on the ramp signal RAMP generated by the DAC 1007 and the pixel signal read from the pixel 1006. The counter memory 1009 has a counter and a memory. The counter is constituted of a plurality of counter units (1-bit counters), and converts a pulse width of a pulse signal into a digital signal by (a count operation of) counting a count clock CNTCLK having a known frequency in a period according to the pulse signal generated by the comparator 1008. The memory is constituted of a plurality of memory units (1-bit memories), holds a signal based on a count value, and outputs the held signal to a horizontal signal transfer line HTL disposed in a horizontal direction according to horizontal transfer control signals H1 to H4 generated by the horizontal scanning circuit 1003 (horizontal transfer operation).

The vertical scanning circuit 1002 controls an operation of the pixel 1006. The horizontal scanning circuit 1003 generates the horizontal transfer control signals H1 to H4 for outputting the signal held by the memory of the counter memory 1009 to the horizontal signal transfer line HTL. The sense amplifier 1004 outputs the signal output to the horizontal signal transfer line HTL as an imaging signal. The control circuit 1005 generates a clock for controlling the DAC 1007, a count clock CNTCLK serving as a clock to be counted by the counter unit of the counter memory 1009, and a holding timing control signal LATCH for controlling an operation in which the memory unit of the counter memory 1009 holds a signal based on a count value. In addition, the control circuit 1005 generates a control signal for controlling the operations of the vertical scanning circuit 1002 and the horizontal scanning circuit 1003.

The solid-state imaging device illustrated in FIG. 8 implements high-speed signal reading by performing pipeline processing on a count operation and a horizontal transfer operation in an operation of reading the pixel signal. That is, the solid-state imaging device illustrated in FIG. 8 holds a signal based on counting at the time of first A/D conversion in the memory and performs second A/D conversion (a count operation) simultaneously when the signal is horizontally transferred.

There is a problem in that a layout region available in the A/D conversion circuit configured to perform A/D conversion for every pixel column is limited to a fine pixel width. Thus, the number of signal lines passing through a vertical direction is also limited by a layout limit.

Figure 9:
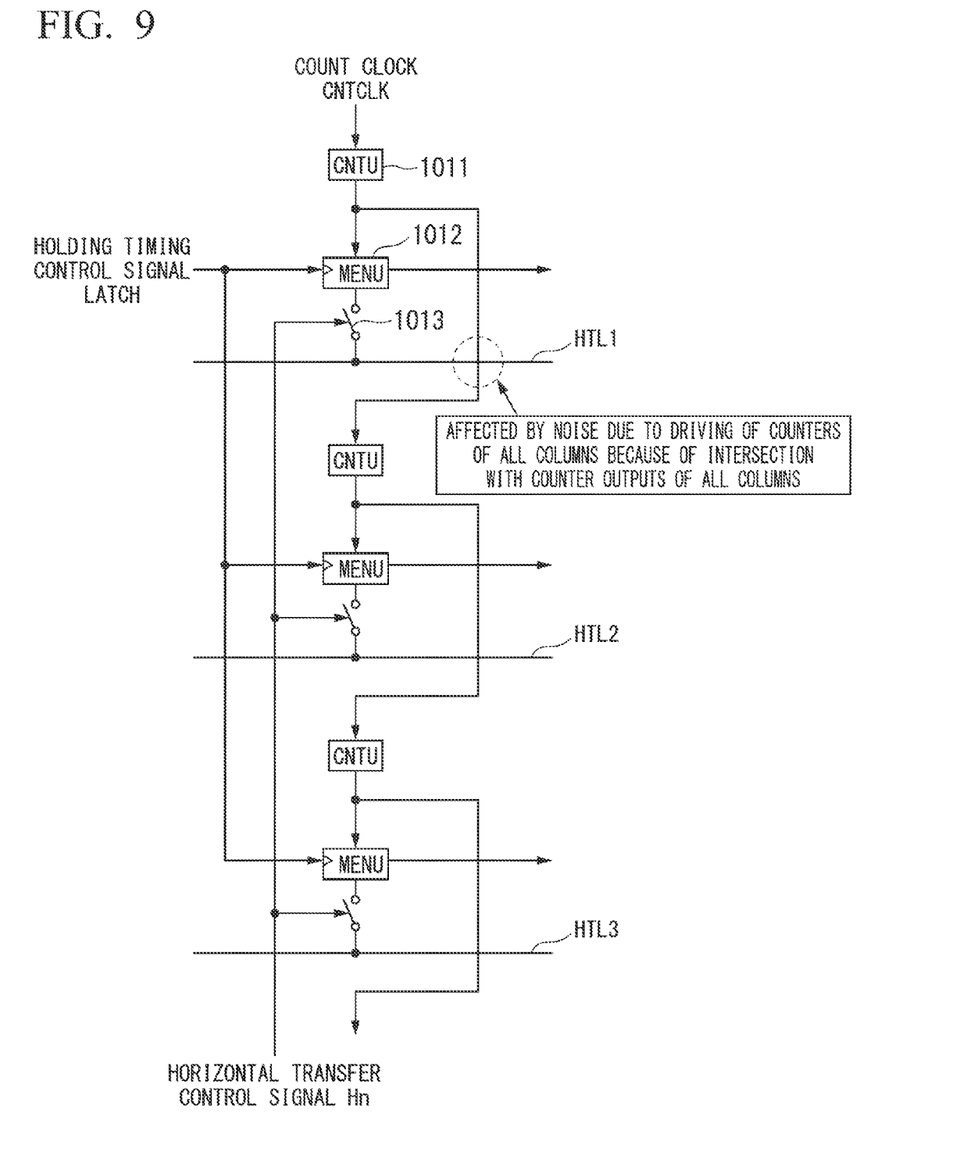
FIG. 9 is a block diagram illustrating a layout of a counter and a memory in the conventional solid-state imaging device.

FIG. 9 illustrates a layout example of the counter units and the memory units constituting the counter memory 1009 for one column. The counter units 1011 which are 1-bit counters are arranged in the vertical direction (column direction) and the memory units 1012 which are 1-bit memories are arranged between the counter units 1011. The memory units 1012 are connected to the horizontal signal transfer lines HTL1 to HTL3 via a switch 1013.

The counter unit 1011 performs a count operation at a rising or falling timing of an input clock and outputs a signal (clock) according to a state of a count value. The counter unit 1011 arranged on the uppermost side in FIG. 9 is a least significant bit (LSB) counter unit 1011 and the count clock CNTCLK is input thereto. The counter unit 1011 outputs a clock to the memory unit 1012 and the higher-bit counter unit 1011.

The memory unit 1012 holds an input signal (high or low state) based on a holding timing control signal LATCH. Each memory unit 1012 is connected to the switch 1013. The switch 1013 can be switched between ON and OFF. In the case of ON, a signal held in the memory unit 1012 is output to the horizontal signal transfer lines HTL1 to HTL3. The switching of ON and OFF of the switch 1013 is performed based on the horizontal transfer control signal Hn (n: column number; in FIG. 9, n is 1 to 4).

In first A/D conversion, each counter unit 1011 counts a count clock CNTCLK or a clock output from the lower-bit counter unit 1011. The comparator 1008 compares voltages of a ramp signal RAMP and a pixel signal and inverts an output when a magnitude relationship between the voltages of the ramp signal RAMP and the pixel signal is reversed. At a point in time at which a signal output from the comparator 1008 has been inverted, each counter unit 1011 stops a count operation. Thereby, a state of a signal output from each counter unit 1011 becomes regular. Subsequently, the memory units 1012 simultaneously hold signals output from the counter units 1011 based on the holding timing control signal LATCH.

Subsequently, a horizontal transfer of signals from the memory units 1012 to the horizontal signal transfer lines HTL1 to HTL3 and second A/D conversion are performed in parallel. In the second A/D conversion, each counter unit 1011 performs a count operation as in the first A/D conversion. While the counter unit 1011 performs the count operation, the memory units 1012 simultaneously output held signals to the horizontal signal transfer lines HTL1 to HTL3 based on the horizontal transfer control signal Hn. At a point in time at which a signal output from the comparator 1008 has been inverted, each counter unit 1011 stops a count operation. Subsequently, as described above, the signal holding and the horizontal transfer operation by the memory unit 1012 are performed.

As illustrated in FIG. 9, the counter unit 1011 and the memory unit 1012 corresponding to each bit are disposed in the vertical direction, so that it is possible to minimize the number of signal lines of the vertical direction and the layout is implemented within a limited width. However, this has the following disadvantages.

The horizontal signal transfer lines HTL1 to HTL3 intersect a signal line through which a clock output from the counter unit 1011 is transferred in all columns. Thus, one disadvantage is that a signal of a first A/D conversion result held in the memory unit 1012 is affected by noise due to driving of the counter unit 1011 of each column while the counter units 1011 of all the columns simultaneously perform count operations in the second A/D conversion. The noise due to the driving of the counter unit 1011 becomes a factor of an error of a signal transfer.

Figure 10:
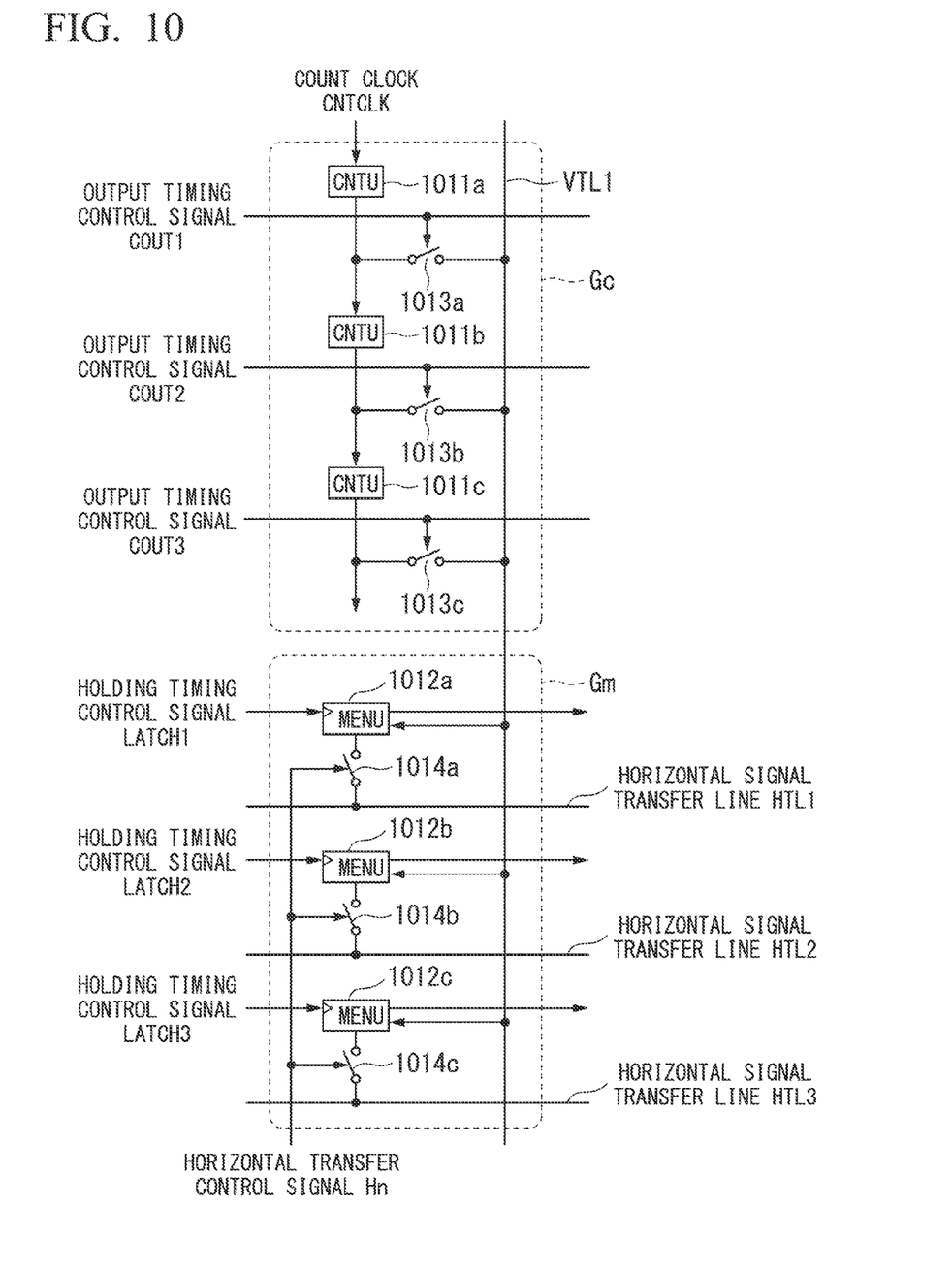
FIG. 10 is a block diagram illustrating a layout of a counter and a memory in the conventional solid-state imaging device.

In order to solve the above-described problem, a layout method of dividing a counter group and a memory group is proposed (for example, see Patent Literature 2). FIG. 10 illustrates a layout example like the layout proposed in Japanese Unexamined Patent Application, First Publication No. 2009-89050, hereinafter referred to as Patent Literature 2. In FIG. 10, a counter group Gc and a memory group Gm are arranged. The counter group Gc includes three counter units 1011a, 1011b, and 1011c and three switches 1013a, 1013b, and 1013c. The counter group Gc includes three memory units 1012a, 1012b, and 1012c and three switches 1014a, 1014b, and 1014c.

The counter units 1011a, 1011b, and 1011c are disposed in the vertical direction. The switch 1013a is connected to the counter unit 1011a and the vertical signal transfer line VTL1 disposed in the vertical direction. The switch 1013b is connected to the counter unit 1011b and the vertical signal transfer line VTL1. The switch 1013c is connected to the counter unit 1011c and the vertical signal transfer line VTL1. The switches 1013a, 1013b, and 1013c can be switched between ON and OFF, and output signals output from the counter units 1011a, 1011b, and 1011c to the vertical signal transfer line VTL1 in the case of ON. The switching between ON and OFF of the switches 1013a, 1013b, and 1013c is performed based on output timing control signals COUT1 to COUT3.

The memory units 1012a, 1012b, and 1012c are disposed in the vertical direction. The memory units 1012a, 1012b, and 1012c are connected to the vertical signal transfer line VTL1, and hold a signal output to the vertical signal transfer line VTL1 based on holding timing control signals LATCH1 to LATCH3. The switch 1014a is connected to the memory unit 1012a and the horizontal signal transfer line HTL1 disposed in the horizontal direction. The switch 1014b is connected to the memory unit 1012b and the horizontal signal transfer line HTL2 disposed in the horizontal direction. The switch 1014c is connected to the memory unit 1012c and the horizontal signal transfer line HTL3 disposed in the horizontal direction. The switches 1014a, 1014b, and 1014c can be switched between ON and OFF, and output signals output from the memory units 1012a, 1012b, and 1012c to the horizontal signal transfer lines HTL1 to HTL3 in the case of ON. The switching between ON and OFF of the switches 1014a, 1014b, and 1014c is performed based on horizontal transfer control signals Hn (n: column number; in FIG. 10, n is 1 to 4).

In the circuit illustrated in FIG. 10, a count operation and a horizontal transfer operation are performed in parallel as follows. In first A/D conversion, after the counter units 1011a, 1011b, and 1011c have stopped the count operations, the control signal is sequentially varied by a combination of the output timing control signal COUT1 and the holding timing control signal LATCH1, a combination of the output timing control signal COUT2 and the holding timing control signal LATCH2, a combination of the output timing control signal COUT3 and the holding timing control signal LATCH3, and signals are transferred from the counter units 1011a, 1011b, and 1011c to the memory units 1012a, 1012b, and 1012c.

First, the switch 1013a is turned on based on the output timing control signal COUT1 and the holding timing control signal LATCH1, and the memory unit 1012a holds a signal output to the vertical signal transfer line VTL1. Subsequently, based on the output timing control signal COUT2 and the holding timing control signal LATCH2, the switch 1013b is turned on and the memory unit 1012b holds a signal output to the vertical signal transfer line VTL1. Subsequently, based on the output timing control signal COUT3 and the holding timing control signal LATCH3, the switch 1013c is turned on and the memory unit 1012c holds a signal output to the vertical signal transfer line VTL1. In this manner, signals based on count values of the counter units 1011a, 1011b, and 1011c are held in the memory units 1012a, 1012b, and 1012c in time division.

After signals are held in all the memory units 1012a, 1012b, and 1012c, the counter units 1011a, 1011b, and 1011c perform count operations in second A/D conversion. While the counter units 1011a, 1011b, and 1011c perform the count operations, the memory units 1012a, 1012b, and 1012c simultaneously output the held signals to the horizontal signal transfer lines HTL1 to HTL3 based on the horizontal transfer control signal Hn.

Because a counter group Gc and a memory group Gm are divided in the circuit illustrated in FIG. 10, noise due to driving of the counter units 1011a, 1011b, and 1011c is not superimposed on the horizontal signal transfer lines HTL1 to HTL3 even when count operations by the counter units 1011a, 1011b, and 1011c and horizontal transfer operations by the memory units 1012a, 1012b, and 1012c are simultaneously performed. Thus, it is possible to implement high-speed signal reading and implement a circuit robust to noise.

SUMMARY

According to a first aspect of the present invention, a solid-state imaging device includes: a first substrate; a second substrate; a pixel unit disposed in the first substrate and in which a plurality of pixels, each of which has a photoelectric conversion element and generates a pixel signal, are disposed in a matrix; and an A/D conversion unit disposed for every one or more columns of the pixels and configured to count a count clock for only a period according to a magnitude of the pixel signal, wherein the A/D conversion unit includes: a plurality of counter units provided in one of the first substrate and the second substrate and configured to generate n-bit count signals (n is a natural number greater than or equal to 2) by counting the count clock; a plurality of memory units provided in the other of the first substrate and the second substrate and configured to hold the count signals and output the held count signals to a plurality of horizontal signal transfer lines; and a connection unit configured to connect each of the plurality of counter units to a corresponding one of the plurality of memory units and simultaneously transfer the count signals from at least two counter units to at least two memory units.

According to a second aspect of the present invention, in the solid-state imaging device according to the first aspect, the first substrate and the second substrate may overlap, the connection unit may include a plurality of bumps, each of which is configured to connect one of the plurality of counter units to a corresponding one of the plurality of memory units, and the number of counter units and the number of memory units may be the same as the number of bumps.

According to a third aspect of the present invention, in the solid-state imaging device according to the first aspect, the first substrate and the second substrate may overlap, the connection unit may include a plurality of bumps, each of which is configured to connect one of the plurality of counter units to a corresponding one of the plurality of memory units, and the number of bumps may be less than the number of counter units and the number of memory units.

According to a fourth aspect of the present invention, in the solid-state imaging device according to the first aspect, the counter unit and the memory unit corresponding to the pixels of the same column may be arranged in a column direction of the pixels.

DETAILED DESCRIPTION OF THE PREFERRED EMBODIMENTS

Hereinafter, embodiments of the present invention will be described with reference to the drawings.

First Embodiment

Figure 1:
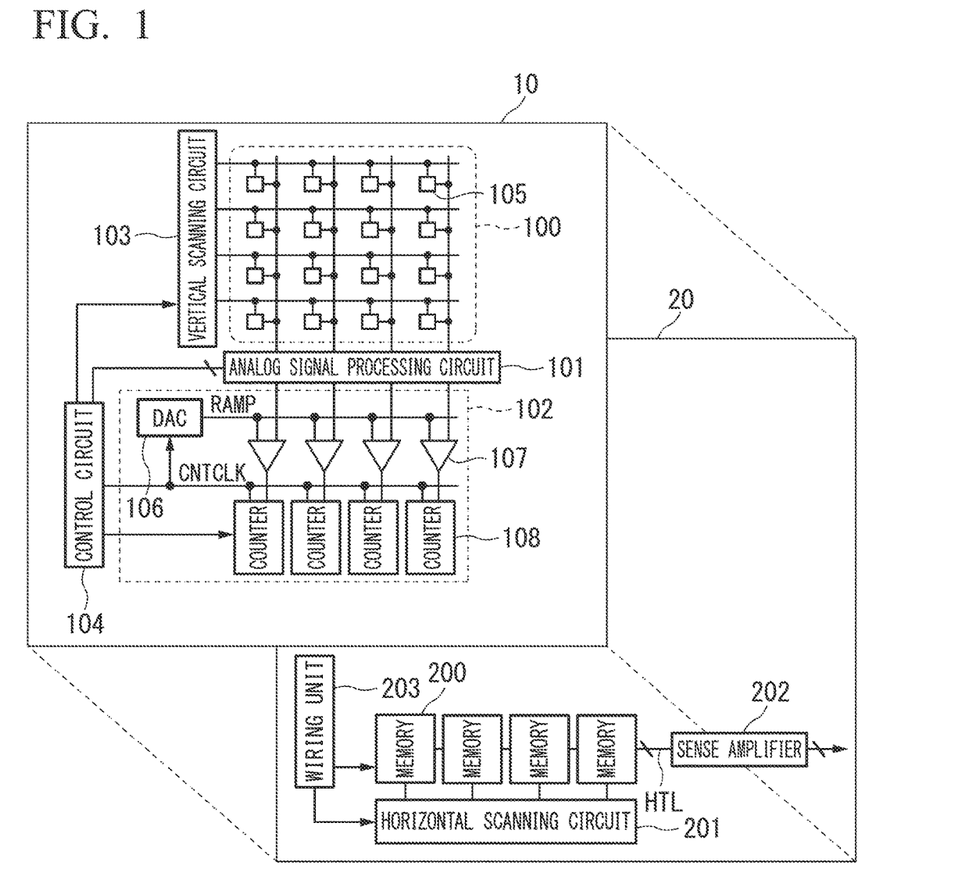
FIG. 1 is a block diagram illustrating a configuration of a solid-state imaging device according to a first embodiment of the present invention.

First, the first embodiment of the present invention will be described. FIG. 1 schematically illustrates a configuration of a solid-state imaging device according to this embodiment. The solid-state imaging device illustrated in FIG. 1 has a first substrate 10 and a second substrate 20. The first substrate 10 and the second substrate 20 are bonded to overlap in a state in which main surfaces (surfaces having relatively larger surface areas than side surfaces) face each other. In order to illustrate a configuration having the solid-state imaging device so that the configuration is easily understood in FIG. 1, a substrate 10 and a second substrate 20 are shifted and shown.

The first substrate 10 has a pixel unit 100, an analog signal processing circuit 101, an A/D conversion circuit 102, a vertical scanning circuit 103, and a control circuit 104. The pixel unit 100 has a plurality of pixels 105 disposed in a matrix. The pixel 105 has a photoelectric conversion element for converting incident light into an electric signal. The analog signal processing circuit 101 performs a correlated double sampling (CDS) process of subtracting a reset level from a signal level for a pixel signal read from the pixel unit 100 or the like. The A/D conversion circuit 102 has a DAC 106, a comparator 107, and a counter 108. The comparator 107 and the counter 108 are disposed for every pixel column.

The DAC 106 generates a ramp signal RAMP which varies stepwise. The comparator 107 generates a pulse signal having a pulse width according to a magnitude of a pixel signal based on the ramp signal RAMP generated by the DAC 106 and a pixel signal processed by the analog signal processing circuit 101. The counter 108 is constituted of a plurality of counter units (1-bit counters) and converts a pulse width of a pulse signal into a digital signal by counting (count operation) a count clock CNTCLK of which a frequency is known in a period according to a pulse signal generated by the comparator 107.

The vertical scanning circuit 103 controls an operation of the pixel 105. The control circuit 104 generates a clock for controlling the DAC 106, a count clock CNTCLK serving as a clock to be counted by a counter unit of the counter 108, a control signal for controlling an operation of the vertical scanning circuit 103, and a control signal for controlling an operation of a circuit disposed on the second substrate 20.

The second substrate 20 has a memory 200, a horizontal scanning circuit 201, a sense amplifier 202, and a wiring unit 203. The memory 200 is disposed for every pixel column. The memory 200 is constituted of a plurality of memory units (1-bit memories), holds a signal based on a count value, and outputs the held signal to the horizontal signal transfer line HTL disposed in the horizontal direction according to the horizontal transfer control signal generated by the horizontal scanning circuit 201 (horizontal transfer operation). The memory 200 is disposed in a position overlapping the counter 108 of the first substrate 10 when viewed in plan view. The horizontal scanning circuit 201 generates a horizontal transfer control signal for outputting the signal held by the memory 200 to the horizontal signal transfer line HTL. The sense amplifier 202 outputs a signal output to the horizontal signal transfer line HTL as an imaging signal. The wiring unit 203 has a wiring (signal line) for supplying a control signal generated by the control circuit 104 of the first substrate 10 to the memory 200 and the horizontal scanning circuit 201.

Figure 2:
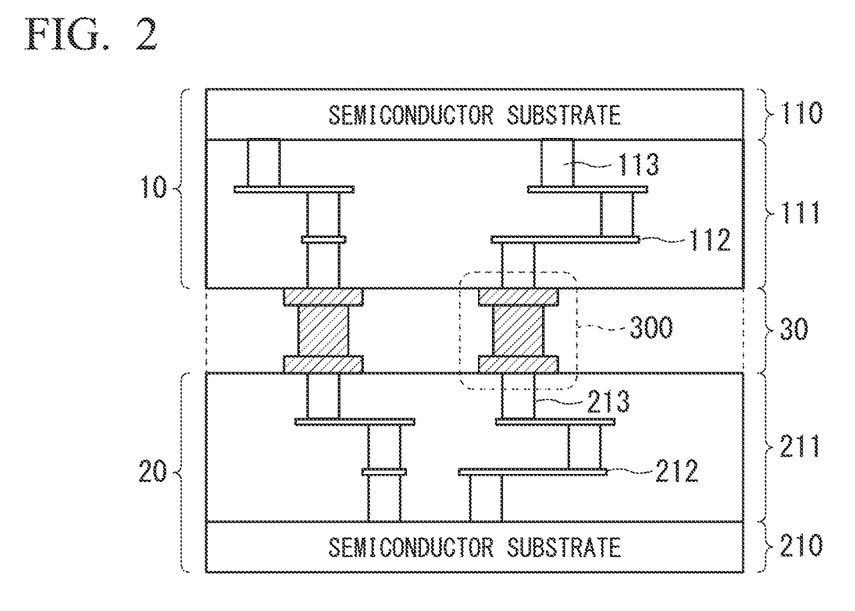
FIG. 2 is a cross-sectional view illustrating a cross-sectional structure of a periphery of a connection unit provided in the solid-state imaging device according to the first embodiment of the present invention.

The first substrate 10 and the second substrate 20 are connected via a connection unit. FIG. 2 illustrates a cross-sectional structure of a periphery of the connection unit. The first substrate 10 has a semiconductor substrate 110 and a wiring layer 111. The wiring layer 111 has wirings 112 of a plurality of layers and connection layers 113 for connecting the wirings 112 of the different layers. The connection layer 113 is formed as a via or contact. The second substrate 20 has the semiconductor substrate 210 and a wiring layer 211. The wiring layer 211 has wirings 212 of a plurality of layers and connection layers 213 for connecting the wirings 212 of different layers. The connection layer 213 is formed as a via or contact. Connection units 30 are disposed between the first substrate 10 and the second substrate 20. The connection unit 30 is constituted of a bump 300. The bump 300 is connected to the connection layer 113 of the first substrate 10 and the connection layer 213 of the second substrate 20. The connection unit 30 and the memory 200 constitute an A/D conversion unit along with the A/D conversion circuit 102 of the first substrate 10.

The counter 108 of the first substrate 10 and the memory 200 of the second substrate 20 are connected via the connection unit 30. In addition, the control circuit 104 of the first substrate 10 and the wiring unit 203 of the second substrate 20 are connected via the connection unit similar to the connection unit 30 illustrated in FIG. 2.

Figure 3:
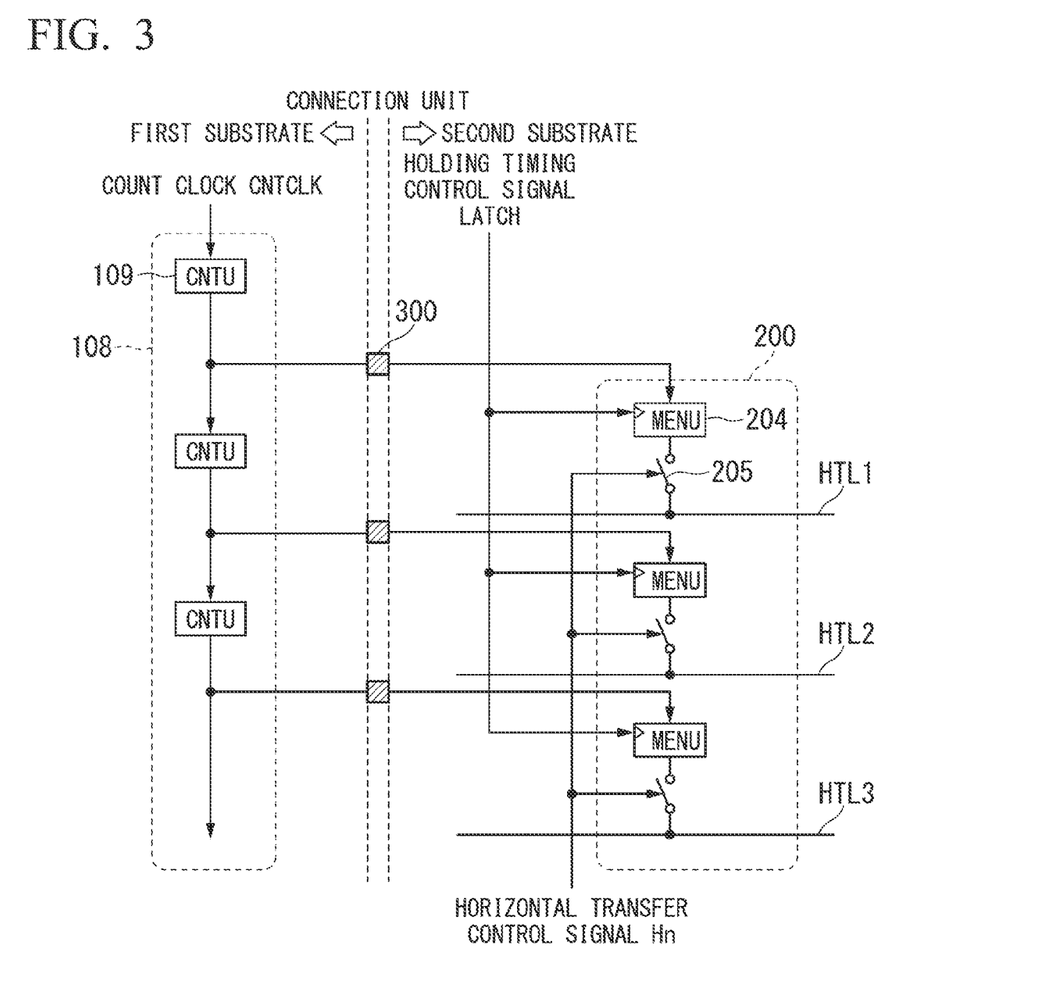
FIG. 3 is a block diagram illustrating a connection relationship of a counter and a memory provided in the solid-state imaging device according to the first embodiment of the present invention.

FIG. 3 illustrates a connection relationship of the counter 108 and the memory 200. The counter 108 has a plurality of counter units 109 for generating a signal (count signal) based on a count value of n (n is a natural number greater than or equal to 2) bits by counting the count clock CNTCLK. The memory 200 has a plurality of memory units 204 for holding a signal output from the counter 108 and outputting the held signal to the horizontal signal transfer lines HTL1 to HTL3 and a plurality of switches 205 for switching connections between the memory units 204 and the horizontal signal transfer lines HTL1 to HTL3.

The plurality of counter units 109 are arranged in the vertical direction (column direction). The counter unit 109 performs a count operation at a rising or falling timing of an input clock and outputs a signal (clock) according to a state of a count value. The counter unit 109 disposed on the uppermost side of FIG. 3 is the LSB counter unit 109, and the count clock CNTCLK is input thereto. The counter unit 109 outputs the clock to the memory unit 204 via the connection unit 30 and outputs the clock to the higher-bit counter unit 109.

The plurality of memory units 204 are arranged in the vertical direction (column direction). The memory unit 204 holds the input signal (high or low state) based on a holding timing control signal LATCH. Each memory unit 204 is connected to the switch 205. The switch 205 can be switched between ON and OFF, and outputs the signal held in the memory unit 204 to the horizontal signal transfer lines HTL1 to HTL3. Switching between ON and OFF of the switch 205 is performed based on a horizontal transfer control signal Hn (n: column number; in FIG. 3, n is 1 to 4).

Each counter unit 109 is connected to a corresponding memory unit 204 via the bump 300. In FIG. 3, the number of counter units 109 and the number of memory units 204 are the same as the number of bumps 300. Because each counter unit 109 is separately connected to the memory unit 204, signals can be simultaneously transferred from the plurality of counter units 109 to the plurality of memory units 204.

Although three counter units and three memory units are provided in FIG. 3, a number of counter units and a number of memory units according to the number (greater than or equal to 2) of valid bits of the counter are actually provided.

Figure 4:
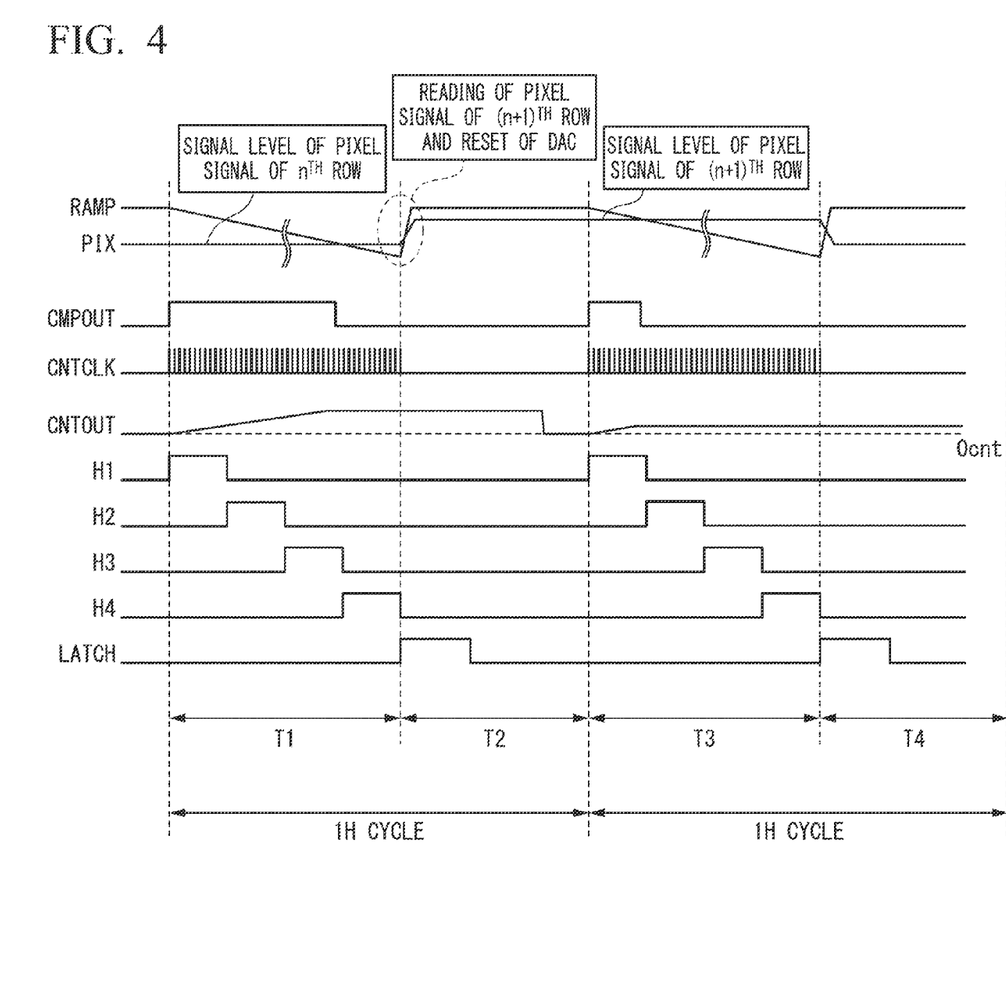
FIG. 4 is a timing chart illustrating an operation of the solid-state imaging device according to the first embodiment of the present invention.

Next, an operation of a solid-state imaging device in A/D conversion will be described with reference to FIG. 4. FIG. 4 illustrates waveforms of signals within a solid-state imaging device. In FIG. 4, waveforms of a ramp signal RAMP, a pixel signal PIX read from the pixel 105, an output signal CMPOUT of the comparator 107, a count clock CNTCLK, a count value CNTOUT of the counter 108, horizontal transfer control signals H1 to H4, and a holding timing control signal LATCH are illustrated. Also, in FIG. 4, only some operations among operations to be continuously iterated are illustrated. It is assumed that A/D conversion of a pixel signal of an $(n-1)^{th}$ row has already been performed before the operation illustrated in FIG. 4.

Hereinafter, an operation in one horizontal period (1H period) for two times will be described. In a period T1 in a first 1H period, the A/D conversion of a pixel signal of an $n^{th}$ row and the output of an A/D conversion result (count value) of a pixel signal of an $(n-1)^{th}$ row are performed. The comparator 107 compares voltages of the ramp signal RAMP and the pixel signal PIX of the $n^{th}$ row. While the voltage of the ramp signal RAMP is greater than the voltage of the pixel signal PIX of the $n^{th}$ row from the start of the comparison, the output signal CMPOUT of the comparator 107 is high.

Simultaneously with the start of the comparison by the comparator 107, each counter unit 109 starts the counting of the count clock CNTCLK or a clock output from the lower-bit counter unit 109. After the start of the count operation, the count value CNTOUT of the counter 108 increases. When the voltage of the ramp signal RAMP is less than the voltage of the pixel signal PIX, the output signal CMPOUT of the comparator 107 becomes low. At a point in time at which the output signal CMPOUT of the comparator 107 has varied to be low, each counter unit 109 stops the count operation. Thereby, the state of the signal output from each counter unit 109 becomes regular.

On the other hand, in a period T1, after the start of the comparison by the comparator 107, the horizontal transfer control signal H1 becomes high. Thereby, when the switch 205 of the memory 200 of a first column is turned on, the memory units 204 of the memory 200 of the first column simultaneously output the held signals to the horizontal signal transfer lines HTL1 to HTL3. The signal output from the memory unit 204 is a signal based on a count value of a pixel signal of an $(n-1)^{th}$ row. The horizontal transfer control signal H1 becomes low after being high and the switch 205 of the memory 200 of the first column is turned off. Subsequently, based on the horizontal transfer control signals H2, H3, and H4, signals are output from the memory units 204 of second, third, and fourth column memories 200 to the horizontal signal transfer lines HTL1 to HTL3 as described above.

In a first 1H period, in a period T2 subsequent to the period T1, an A/D conversion result (count value) of a pixel signal of an $n^{th}$ row is transferred to the memory 200. The holding timing control signals LATCH output from the memories 200 of all columns simultaneously become high. The memory units 204 simultaneously fetch signals output from the counter units 109. The signal output from the counter unit 109 is a signal based on a count value of a pixel signal of an $n^{th}$ row. Subsequently, the holding timing control signals LATCH output to the memories 200 of all columns simultaneously become low and each memory unit 204 holds the fetched signal. In the period T2, the reading of the pixel signal PIX of the $(n+1)^{th}$ row and the reset of the DAC 106 are performed in parallel with the above-described operation.

In a period T3 in a second 1H period, the A/D conversion of the pixel signal of the $(n+1)^{th}$ row and the output of the A/D conversion result (count value) of the pixel signal of the $n^{th}$ row are performed. Because the operation in the period T3 is similar to the operation in the period T1, description thereof is omitted.

In the second 1H period, in a period T4 subsequent to the period T3, the A/D conversion result (count value) of the pixel signal of the $(n+1)^{th}$ row is transferred to the memory 200. Because the operation in the period T4 is similar to the operation in the period T2, description thereof is omitted.

Although the count operation by the counter 108 and the horizontal transfer operation by the memory 200 are performed in the operation illustrated in FIG. 4, noise due to driving of the counter 108 is not superimposed on the horizontal signal transfer lines HTL1 to HTL3 because the counter 108 and the memory 200 are provided on different substrates. Thus, it is possible to reduce an influence of noise due to driving of the counter 108 serving as a factor of an error of a signal transfer. In addition, because signals are simultaneously transferred from the plurality of counter units 109 to the plurality of memory units 204, it is possible to implement high-speed signal reading as compared to a method of transferring a signal transfer from the counter to the memory in time division as in Patent Literature 2.

Figure 5:
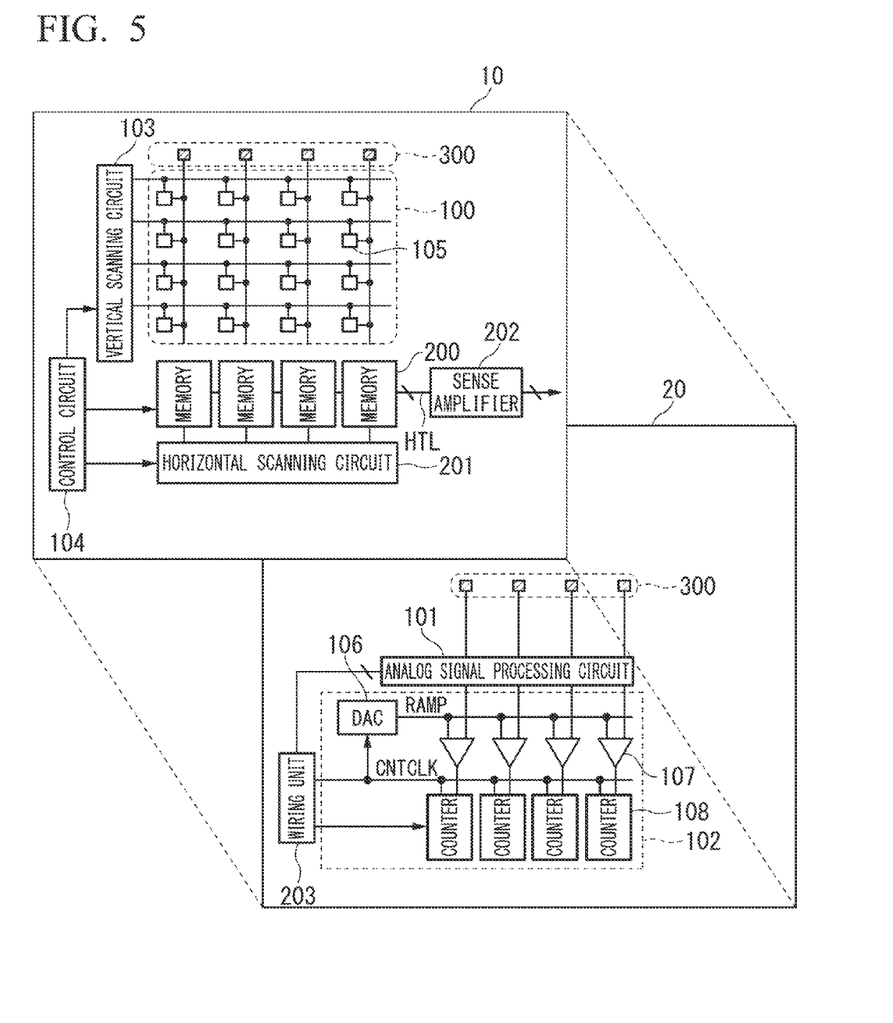
FIG. 5 is a block diagram illustrating a configuration of the solid-state imaging device according to the first embodiment of the present invention.

Next, a modified example of this embodiment will be described. A configuration of the solid-state imaging device is not limited to the configuration illustrated in FIG. 1, and may be any configuration other than the configuration illustrated in FIG. 1 as long as the counter 108 and the memory 200 are provided in different substrates. FIG. 5 schematically illustrates another configuration example of the solid-state imaging device. In FIG. 5, the same configuration as the configuration illustrated in FIG. 1 is assigned the same reference sign.

In FIG. 5, the analog signal processing circuit 101 and the A/D conversion circuit 102 are provided in the second substrate 20, and the memory 200, the horizontal scanning circuit 201, and the sense amplifier 202 are provided in the first substrate 10. In the first substrate 10, the bump 300 is provided for every pixel column and the vertical signal transfer line connected to the pixel 105 of each column is connected to the bump 300. In addition, in the second substrate 20, the bump 300 is provided and the analog signal processing circuit 101 is connected to the bump 300. The bumps 300 of the first substrate 10 and the bumps 300 of the second substrate 20 are the same. In addition, although not illustrated, the counters 108 and the memories 200 are connected via bumps separate from the bumps 300 illustrated in FIG. 5.

In FIG. 5, the pixel signal read from the pixel 105 is input to the second substrate 20 via the bump 300. After the input pixel signal is processed by the analog signal processing circuit 101, the A/D conversion circuit 102 converts the processed signal into a digital signal. After the digital signal is input to the first substrate 10 and held in the memory 200, the held digital signal is horizontally transferred.

Although one comparator 107, one counter 108, and one memory 200 are provided for pixels 105 of one column in the solid-state imaging device illustrated in FIGS. 1 and 5, one comparator 107, one counter 108, and one memory 200 may be provided for pixels 105 of a plurality of columns and the comparator 107, the counter 108, and the memory 200 may be shared among the plurality of columns.

As described above, according to this embodiment, it is possible to reduce an influence of noise due to driving of a counter and implement high-speed signal reading.

Second Embodiment

Figure 6:
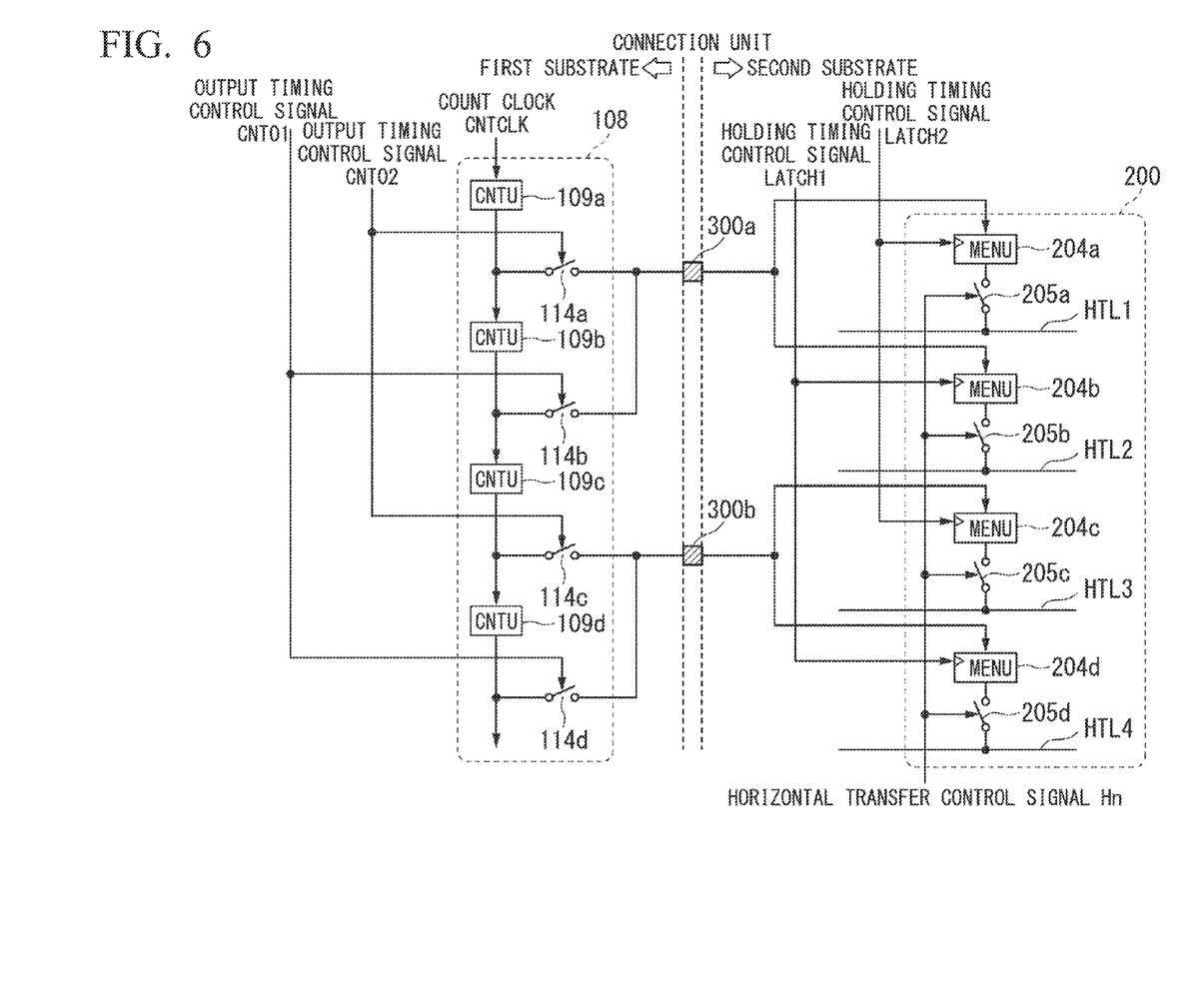
FIG. 6 is a block diagram illustrating a connection relationship of a counter and a memory provided in a solid-state imaging device according to a second embodiment of the present invention.

Next, the second embodiment of the present invention will be described. The overall configuration of the solid-state device according to this embodiment is the same as the configuration illustrated in FIG. 1. FIG. 6 illustrates a connection relationship of the counter 108 and the memory 200.

The counter 108 has four counter units 109a, 109b, 109c, and 109d and four switches 114a, 114b, 114c, and 114d. The memory 200 has four memory units 204a, 204b, 204c, and 204d and four switches 205a, 205b, 205c, and 205d. In addition, two bumps 300a and 300b are provided.

The switch 114a is connected to the counter unit 109a and the bump 300a, the switch 114b is connected to the counter unit 109b and the bump 300a, the switch 114c is connected to the counter unit 109c and the bump 300b, and the switch 114d is connected to the counter unit 109d and the bump 300b. The memory unit 204a and the memory unit 204b are connected to the bump 300a, and the memory unit 204c and the memory unit 204d are connected to the bump 300b. The switch 205a is connected to the memory unit 204a and the horizontal signal transfer line HTL1, the switch 205b is connected to the memory unit 204b and the horizontal signal transfer line HTL2, the switch 205c is connected to the memory unit 204c and the horizontal signal transfer line HTL3, and the switch 205d is connected to the memory unit 204d and the horizontal signal transfer line HTL4.

In this embodiment, two counter units and two memory units share one bump. Thus, it is possible to reduce the number of bumps as compared to the first embodiment. This embodiment is particularly effective when a region in which the bumps can be disposed is limited.

Switching between ON and OFF of the switch 114a of the two switches 114a and 114b connected to two counter units 109a and 109b sharing the same bump 300a is performed based on an output timing control signal CNT02 and switching between ON and OFF of the switch 114b is performed based on an output timing control signal CNT01. In addition, switching between ON and OFF of the switch 114c of the two switches 114c and 114d connected to two counter units 109c and 109d sharing the same bump 300b is performed based on the output timing control signal CNT02 and switching between ON and OFF of the switch 114d is performed based on the output timing control signal CNT01.

Signal holding by the memory unit 204a of the two memory units 204a and 204b sharing the same bump 300a is performed based on a holding timing control signal LATCH2, and signal holding by the memory unit 204b is performed based on a holding timing control signal LATCH1. In addition, signal holding by the memory unit 204c of the two memory units 204c and 204d sharing the same bump 300b is performed based on the holding timing control signal LATCH2, and signal holding by the memory unit 204d is performed based on the holding timing control signal LATCH1.

Next, an operation of the solid-state imaging device in A/D conversion will be described. Because an operation in a period other than the periods T2 and T4 in FIG. 4 is similar to the above-described operation, description thereof is omitted. Hereinafter, an operation of transferring the A/D conversion result (count value) of the pixel signal to the memory 200 in the periods T2 and T4 will be described. An operation to be described below is common in the periods T2 and T4.

Figure 7:
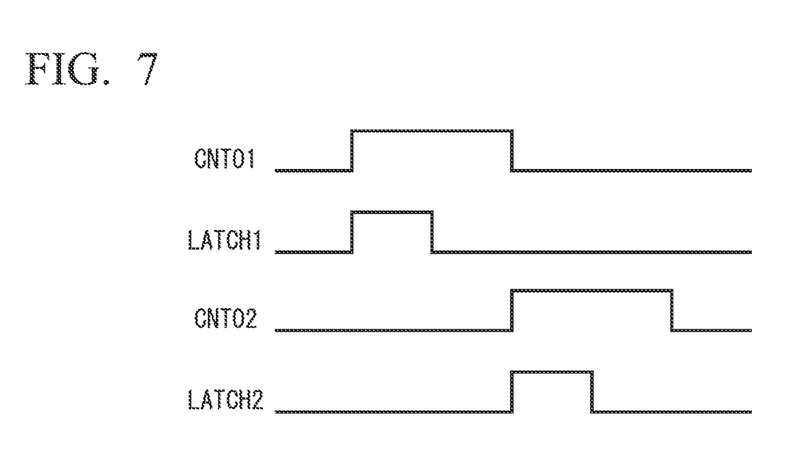
FIG. 7 is a timing chart illustrating an operation of the solid-state imaging device according to the second embodiment of the present invention.

FIG. 7 illustrates waveforms of signals within the solid-state imaging device. In FIG. 7, the waveforms of the output timing control signals CNTO1 and CNTO2 and the holding timing control signals LATCH1 and LATCH2 are illustrated.

First, the output timing control signal CNTO1 becomes high and the switches 114b and 114d are turned on. Thereby, signals output from the counter units 109b and 109d are input to the memory units 204b and 204d, respectively. The holding timing control signal LATCH1 becomes high simultaneously when the output timing control signal CNTO1 becomes high. The memory unit 204b fetches signals output from the counter unit 109b, and the memory unit 204d fetches signals output from the counter unit 109d. Subsequently, the holding timing control signal LATCH1 becomes low and the memory units 204b and 204d simultaneously hold the fetched signals. Subsequently, the output timing control signal CNTO1 becomes low and the switches 114b and 114d are turned off.

Subsequently, the output timing control signal CNTO2 becomes high and the switches 114a and 114c are turned on. Thereby, signals output from the counter units 109a and 109c are input to the memory units 204a and 204c, respectively. The holding timing control signal LATCH2 becomes high simultaneously when the output timing control signal CNTO2 becomes high. The memory unit 204a fetches signals output from the counter unit 109a, and the memory unit 204c fetches signals output from the counter unit 109c. Subsequently, the holding timing control signal LATCH2 becomes low and the memory units 204a and 204c simultaneously hold the fetched signals. Subsequently, the output timing control signal CNTO2 becomes low and the switches 114a and 114c are turned off.

Although two counter units and two memory units share one bump in FIG. 6, the present invention is not limited thereto and it is only necessary for two or more counter units and two or more memory units to share one bump. However, it is necessary to provide at least two bumps so that signals can be simultaneously transferred from at least two counter units corresponding to the same pixel column to at least two memory units so as to perform signal reading at a high speed.

Although the counter unit and the memory unit corresponding to the same pixel column share the bump in FIG. 6, the present invention is not limited thereto and the counter unit and the memory unit corresponding to an adjacent pixel column may share the bump.

As described above, according to this embodiment, it is possible to reduce the number of bumps.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

The present invention is widely applicable to solid-state imaging devices used in digital cameras, digital video cameras, endoscopes, and the like and it is possible to reduce an influence of noise due to driving of a counter and implement high-speed signal reading.

What is claimed is:

1. A solid-state imaging device comprising:
   a first substrate;
   a second substrate;
   a pixel unit disposed in the first substrate and in which a plurality of pixels, each of which has a photoelectric conversion element and generates a pixel signal, are disposed in a matrix; and
   an analog-to-digital (A/D) conversion unit disposed for every one or more columns of the pixels and configured to count a count clock for only a period according to a magnitude of the pixel signal,
   wherein the A/D conversion unit includes:
   a plurality of counter units provided in one of the first substrate and the second substrate and configured to generate n-bit count signals (n is a natural number greater than or equal to 2) by counting the count clock;
   a plurality of memory units provided in the other of the first substrate and the second substrate and configured to hold the count signals and output the held count signals to a plurality of horizontal signal transfer lines; and
   a connection unit configured to connect each of the plurality of counter units to a corresponding one of the plurality of memory units and simultaneously transfer the count signals from at least two counter units to at least two memory units.

2. The solid-state imaging device according to claim 1, wherein the first substrate and the second substrate overlap,
   wherein the connection unit includes a plurality of bumps, each of which is configured to connect one of the plurality of counter units to a corresponding one of the plurality of memory units, and
   wherein the number of counter units and the number of memory units are the same as the number of bumps.

3. The solid-state imaging device according to claim 1, wherein the first substrate and the second substrate overlap,
   wherein the connection unit includes a plurality of bumps, each of which is configured to connect one of the plurality of counter units to a corresponding one of the plurality of memory units, and
   wherein the number of bumps is less than the number of counter units and the number of memory units.

4. The solid-state imaging device according to claim 1, wherein the counter unit and the memory unit corresponding to the pixels of the same column are arranged in a column direction of the pixels.

* * * * *